United States Patent [19]

Kompanek

[11] 4,190,785
[45] Feb. 26, 1980

[54] PRESSURE SENSITIVE SIGNAL GENERATOR USING PIEZOELECTRIC COATING

[75] Inventor: Harry W. Kompanek, Santa Barbara, Calif.

[73] Assignee: Essex Transducers Corporation, Carpinteria, Calif.

[21] Appl. No.: 889,998

[22] Filed: Mar. 24, 1978

Related U.S. Application Data

[63] Continuation-in-part of Ser. No. 748,993, Dec. 9, 1976, abandoned.

[51] Int. Cl.² .............................................. H01L 41/10
[52] U.S. Cl. .................................... 310/330; 310/311; 310/328; 310/338; 310/339; 310/358; 340/365 A; 29/25.35
[58] Field of Search ............... 310/311, 328, 330, 334, 310/336, 338, 339, 357, 358, 359, 335; 340/365 A

[56] References Cited

U.S. PATENT DOCUMENTS

| | | | |
|---|---|---|---|
| 2,384,541 | 9/1945 | Fruth | 310/358 X |
| 3,213,027 | 10/1965 | Fatuzzo et al. | 310/357 X |
| 3,247,711 | 4/1966 | Howatt | 310/338 |
| 3,475,551 | 10/1969 | Green et al. | 310/335 |
| 3,780,572 | 12/1973 | Rocha | 310/335 X |
| 3,935,485 | 1/1976 | Yoshida et al. | 310/339 |
| 3,940,637 | 2/1976 | Ohigashi et al. | 310/339 |
| 3,943,387 | 3/1976 | Veith | 310/358 |
| 3,948,089 | 4/1976 | Shaw | 310/328 |

OTHER PUBLICATIONS

Brushed-on Piezoelectric Transducers by J. G. Martner, *Ultrasonics*, vol. 7, No. 4, Oct. 1969, pp. 234–237.

*Primary Examiner*—Mark O. Budd
*Attorney, Agent, or Firm*—Anthony J. Criso

[57] ABSTRACT

The construction and method of operating a signal generator which provides an electrical output in response to an input mechanism such as a loading by finger are disclosed. The generator has the appearance of a plate and includes a sandwich structure comprising a conductive substrate, a coating of piezoelectric material and usually a plurality of discrete electrodes joined to the exposed surface thereof. The coating is deposited on the substrate as a slurry and is chemically bonded to the substrate. In order to produce an electrical output signal, prescribed locations on the plate are subjected to a force such as can be applied by the touch of a finger and a voltage is generated across the piezoelectric coating between the point of contact on the substrate and the adjacent electrode. The output signal is used either directly or after being amplified to drive various functionally responsive devices.

15 Claims, 4 Drawing Figures

PRESSURE SENSITIVE SIGNAL GENERATOR USING PIEZOELECTRIC COATING

CROSS REFERENCE TO RELATED APPLICATION

This patent application is a continuation in part of application Ser. No. 748,993 which was filed on Dec. 9, 1976, now abandoned.

BACKGROUND OF THE INVENTION

The present invention relates to electrical devices and more particularly to signal generators which are touch sensitive and produce output electrical signals in response to an input stimulus of force.

Products having a wide range of applicability are in use today and many of them either have a keyboard or could be utilized more conveniently if a suitable keyboard were available. Machines such as calculators, typewriters, computers, telephones and home appliances to mention only a few have the common requirement for a precise input which determines the actual functioning of the particular device.

In the case of any typewriters and calculators, for example, mechanical keys are used to input the machine. Such systems are tried and tested and have an established acceptance in some markets. However, the individual key input type device tends to involve a relatively large number of moving mechanical parts which is often relatively bulky and heavy. In addition, such systems require servicing and cleaning at periodic intervals in order to maintain acceptance operating efficiency. Obviously, as the number and complexity of the linkages increases, such as is found in some typewriters, the cost of manufacture and assembly becomes significant.

The art in this field is developed somewhat and for certain applications, particularly in home appliances, automobiles and calculators, the use of individual keys or buttons continues to be used to provide a mechanical input which is quickly converted into electrical signals which are then determinative of the operation of the machines. Such use of buttons has been a considerable improvement in certain applications although they still contain inherent disadvantages which seem to center about the input button portion of the device. For example, the buttons have a tendency to jam or break and also since they are undergoing physical displacement, they provide locations through which dirt and foreign particles can enter into the control system. The latter problem has been minimized considerably by the use of a protective layer of flexible material which is typically rubber or other suitable plastic. Such covers can be very effective in minimizing the amount of foreign material which accumulates in and around the buttons. The covers do not, however, solve the problem of wear and maintenance associated with the contact points inherent in the button system.

Another variation to the button control panel is the dial device such as is found on many telephones. With the use of a dial, discrete inputs can be provided while avoiding many of the disadvantages described above associated with either the buttons or the keys. However, the dial is a relatively large and bulky mechanical system that does rely on contacts and is subject to both wear and breakage.

Alternatively some applications involving microwave ovens and elevators have found use for capacitive or resistive type switches which experience a change in electrical characteristics when activated. Such devices were well received although they are considered erratic during unusual circumstances such as overvoltages or excessive heating.

SUMMARY OF THE INVENTION

An object of the present invention is to produce electrical signals in response to the physical displacement of a surface.

According to the present invention, a signal generator formed from a sandwich structure of electrical conductors and piezoelectric material comprises a common electrode formed as a continuous substrate, a coating of piezoelectric material applied to one side of the substrate, and a second electrode formed at a discrete location on the exposed surface of the piezoelectric. The piezoelectric is polarized so that any force loading of the piezoelectric such as occurs as the result of pressure or bending applied to the substrate with a finger creates a usable electrical signal having a predictable polarity between the substrate and the second electrode located adjacent to the pressure point.

One of the features of the present invention is the upper surface of the signal generator which is a smooth, flat structural element serving as a common electrode. In addition, the thin and flexible piezoelectric coating in the device can be put down as one continuous layer by slurry techniques. The coating is chemically bonded to a substrate. The piezoelectric is suitably polarized and protected from contamination by water and other materials. Multiple areas beneath the outer surface can be sensitized by forming discrete electrodes at preselected sites. The generator produces output electrical signals completely independent of any supplemental power sources and these signals can be coded. The strength of the signal can be varied by controlling the thickness of the coating, the total area sensitized or the amount of pressure applied. In some applications, the substrate assembly is supported by a base.

The present invention can be entirely passive and eliminate the necessity of electric switch contacts. Yet the signal generator produces an output voltage which can be as high as ten to twenty volts on the basis of a nominal force applied to the surface of the generator. The output signal is of sufficient strength to drive a metal oxide silicone device directly, or may be combined with an auxiliary power source and thereby produce a whole range of functions, some of which involve the consumption of considerable amounts of power. The voltage signal between any particular second electrode and the common electrode is discernible from all other signals. The substrate which is typically a sheet of metal can be made aesthetically pleasing while being resistive to ordinary wear and abuse. Also, the exposed surface of the substrate can be marked to locate the active regions adjacent to the second electrodes. The signal generator is simple, small, lightweight and inexpensive to manufacture.

The foregoing and other objects, features and advantages of the present invention will become more apparent in the light of the following detailed description of preferred embodiments as illustrated in the accompanying drawing.

DESCRIPTION OF A PREFERRED EMBODIMENT

Figure 1:
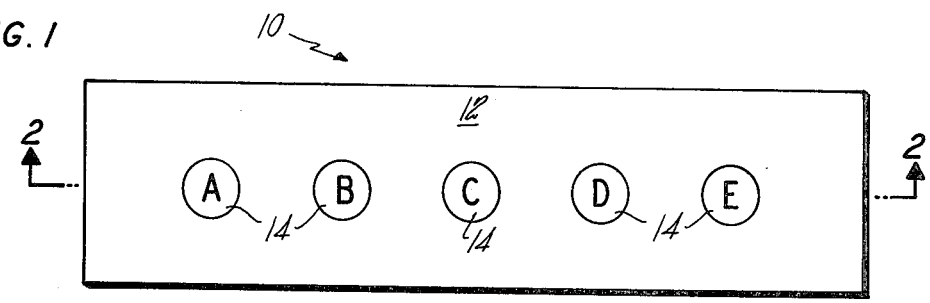
FIG. 1 is a simplified schematic diagram of a signal generator in accordance with the present invention as viewed from the top.
Figure 2:
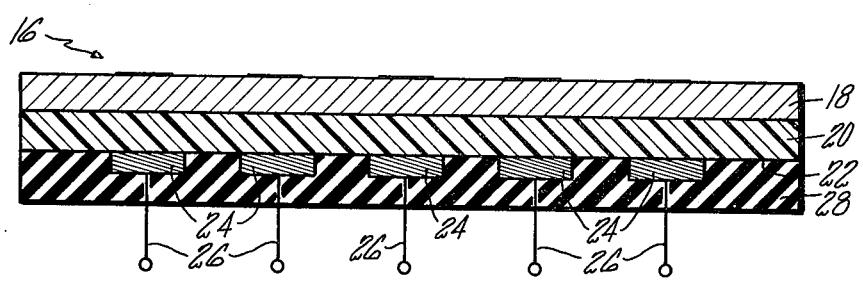
FIG. 2 is a cross-sectional view through the signal generator.

A top view of a simplified signal generator 10 in accordance with the present invention is shown in FIG. 1. An upper surface 12 is shown with touch points 14 represented thereon. FIG. 2 is a vertical view in the direction 2—2 and shows a generator comprising a sandwich structure 16 which includes a substrate 18, a coating 20 of ceramic material having an accessible surface 22 and multiple electrodes 24. An electrode connector 26 leads from each electrode and passes through a sealant 28 which cover both the electrodes and the exposed surface of the coating.

In a typical configuration as shown in FIG. 1, the signal generator has an exposed surface which is approximately three-quarters of an inch wide and three inches long. Each of the touch points is approximately three-eighths of an inch in diameter and is identified by a paint marking on the surface 12. The substrate is a sheet of metal which is readily flexed and has a thickness of approximately ten mils. An electrode having an area approximately one-half inch square and corresponding to each touch points is formed on the underside of the ceramic coating as is shown in FIG. 2. The piezoelectric coating is five mils in thickness and is kept from the edges of the substrate. Each electrode which is formed on the surface 22 of the ceramic material is of the same general thickness as the coating and is joined to an individual electrode connector 26. The sealant 28 is shown applied to the entire exposed surface of the coating including the electrodes as well to prevent contamination of the coating. The sealant is a compatible epoxy material approximately two to three mils in thickness. In some applications the entire generator is backed with a silicon material approximately one hundred mils in thickness.

Conceptually the operation of a signal generator in accordance with the present invention is straightforward. The substrate can be maintained at electrical ground so that as load is applied to one of the touch points such as can occur through ordinary contact with a finger, the piezoelectric material immediately beneath the touch point becomes subjected to bending and an electrical signal is generated between the substrate and the electrode adjacent to the touch point at the location at which the force is applied. The piezoelectric material producing an electric signal in this manner is operating in what is sometimes referred to as the g 15 mode. The signal can be used directly to activate a reaction sequence, as in the driving of a complimentary metal oxide silicon (CMOS) device, or indirectly, with a power assist device to activate a door lock or an automobile ignition.

The substrate is usually a smooth, flat sheet of electrically conductive material although it need not necessarily be either smooth or flat. Materials such as copper, aluminum, silver, steel and other alloys are suitable as a substrate being used either alone or with a plating. The substrate construction must be thin enough overall to yield under the amount of pressure anticipated so that a suitable compressive force will be applied to the piezoelectric material coated thereon to produce a signal having a strength suitable for the application. Since the strength of the signal can be varied by controlling the thickness of the piezoelectric material as well as the total area which has been sensitized or the amount of pressure which is applied there are several variables which can be traded off one against another. As a practical matter, the thickness of the substrate is typically less than one hundred mils, a thickness suitable for producing the desired output signal and still thick enough to allow the sandwich structure to withstand a reasonable amount of wear and even abuse.

Figure 3:
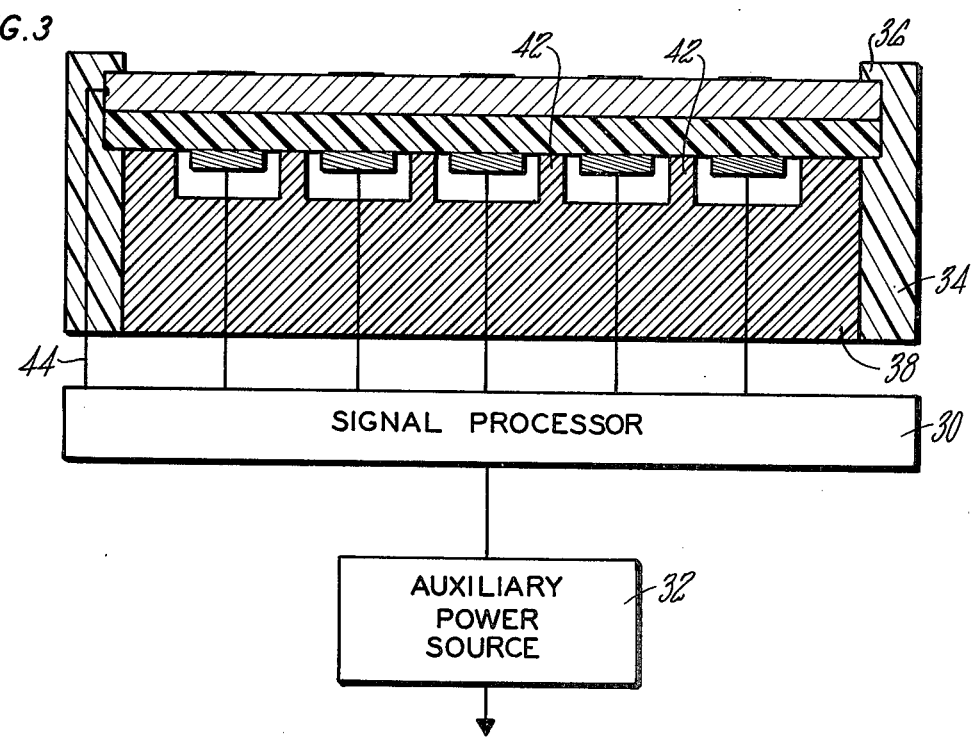
FIG. 3 is a sectional view of the touch switch including some additional apparatus shown schematically.

The signal generator is shown in FIG. 3 in combination with a signal processor 30 and an auxiliary power source 32. The sandwich element 16 is fitted into a frame 34 having a cap 36 which completely encloses the perimeter of the upper surface 12. Contained within the frame is a rigidly held base 38 which supports the sandwich structure. The base contains cutouts 40 which are located beneath each electroce with each cutout being slightly larger than the electrode which fits therein. Between adjacent cutouts a bridge 42 is formed. The combination of the base and the frame securely holds the signal generator and provides a means for attachment as well. Further the base is in direct contact with the sandwich element at essentially all points on the lower surface other than those occupied by the electrodes. This construction adds substantial rigidity to the signal generator and provides very good isolation between the adjacent touch point electrode combinations. Therefore, as a particular touch point is depressed creating a signal in the adjacent electrode, the effect of the base is to minimize any displacement which might otherwise occur at adjacent sensitive areas. Also shown in FIG. 3 is a substrate connector 44 which provides an electrical connection between the substrate and the signal processor.

The application of a coating of piezoelectric material onto the substrate is critical to the physical embodiment which the present invention takes as well as the practicalness of its production. Finely divided ceramic material such as barium titanate, lead zirconate, lead titanate or lead metaniobate are mixed with a phosphate additive and water to form a slurry. The ceramic is reduced to a very fine particle size and generally the finer the particle size the better the adherence between the coating and the substrate. The slurry is applied to the substrate in a thickness which depends upon the requirements of the application although as a practical matter, a typical coating is several mils in thickness and infrequently is the coating in excess of about twenty mils. After the coating has been applied it is allowed to dry either at a few hundred degrees above room temperature or higher if a shorter drying time is necessary.

For one of the preferred embodiments of the invention, a hard ceramic powder was formed by mixing lead zirconate and lead titanate in the respective percentages by weight of fifty two and forty eight and then firing the mixture. A highly acid solution comprising phosphoric acid, chromic acid, gluconic acid and zinc oxide was then admixed with the ceramic powder. The gluconic acid functions as a plasticizer and a wetting agent and allows the slurry to be more dense. The acid solution is characteristically at about 0.85 pH under room temperature conditions and as long as the ceramic powder is in the form of finely classified particles the slurry is highly dense.

The dense slurry was applied to a stainless steel substrate by a flow process although dip and spray techniques are feasible, and then cured at a temperature of approximately three hundred seventy five degrees Farenheit for approximately one-half hour. The curing process reduced the slurry to a hard ceramic which was chemically joined to the substrate as an extremely hard coating. The coating could not be removed easily although with mechanical processes such as scraping the surface of the substrate was found to be very much etched. After the slurry was cured and the coating formed, the coating was polarized with a direct current voltage of about fifty volts per unit of coating thickness.

The precise chemical structure of the material in the transition zone from the substrate to the ceramic coating is not known with any certainty although the ceramic is definitely chemically bound to the substrate. According to one accepted rationale, the lead zirconate and lead titanate interbond with the phosphate and chromate materials to form a very complex phosphate-chromate compound which is piezoelectric in nature. Probably what occurs is the phosphates interact with the stainless steel surface directly and attach to the substrate in a manner which allows some lead zirconate and lead titanate particles to find their way into the locations at which the acid interacts intimately with the substrate. This transition zone is also intimately interconnected with the complex phosphate-chromate compound described previously and consequently the entire region immediately adjacent to the substrate right through to the ceramic coating is to some degree piezoelectric in nature.

The actual piezoelectric activity for the slurry is controlled to a large degree by the pH of the acid solution in the slurry formation, the higher the pH of the acid the lower the dielectric constant and resistivity of the slurry. This observation suggests that the phosphate itself is to a large degree piezoelectric although not nearly as piezoelectric as the lead zirconate-lead titanate powder per se.

Evidently the phosphate adds substantially to the piezoelectric activity of the signal generator manufactured in accordance with the present invention and the reason the slurry chemically attaches so rigidly to the stainless steel substrate is due to the phosphate-chromate chemical activity of the slurry. In effect, the slurry is causing an etching effect on the substrate and the phosphate ceramic coating is intimately formed at the interface of the substrate resulting in a very strong bond. For additional discussion of coating compositions, deposition processes, and resulting articles see U.S. Pat. No. 4,056,654 which issued on Nov. 1, 1977 to Harry W. Kompanek, the substance and disclosure of which is hereby incorporated by reference into the present application.

Once the piezoelectric material has been bonded to the substrate, the exposed surface of the piezoelectric is suitably masked and by various techniques including electroplating, painting, or spraying conductive materials such as silver platinum, palladium, copper or graphite electrodes are formed on the exposed surface of the coating to complete the sandwich structure which is then polarized.

Water and other materials which occur freely in the atmosphere and in many working environments can interact with and be detrimental to the piezoelectric material if allowed to interact therewith. Therefore, a sealant is frequently applied over the exposed surface of the piezoelectric material to preserve its inherent characteristics. The sealant can be rubber, plastic, or any other material which is sufficiently flexible and will form a barrier between the piezoelectric material and its environment without itself chemically reacting with the piezoelectric.

Figure 4:
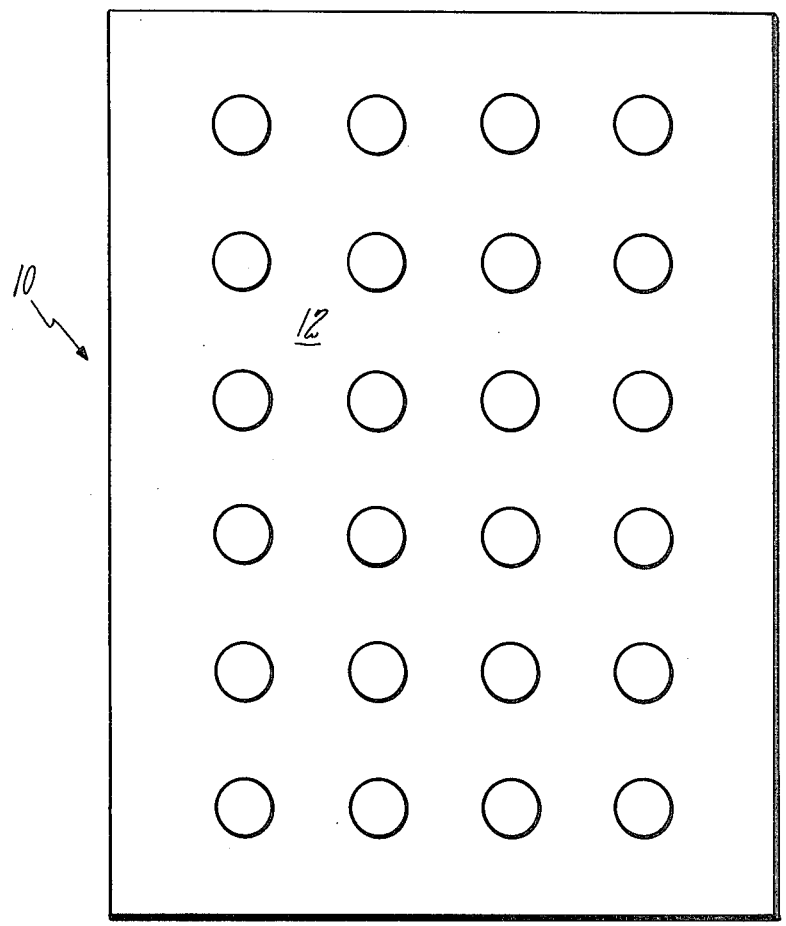
FIG. 4 is a simplified schematic diagram of a signal generator surface having many touch sensitive locations.

An alternate embodiment of the present invention which includes a total of twenty-four touch sensitive locations is shown in FIG. 4. The surface is approximately three inches wide and five inches long. The touch points are about three-eighths of an inch in diameter and are applied to an aluminum substrate having a twenty-five to fifty mil thickness. The thickness of the piezoelectric coating varies between five and ten mils although it can be significantly thicker in some applications.

The data shown in Table 1 are representative of the output provided by a signal generator such as is described above with the substrate being depressed approximately one to two mils in each instance.

Not only is the generator able to produce output signals as high as ten to twenty volts but the device is able to do so without the use of electric switch contacts which can be a source of wear, failure and even a safety consideration in some applications. Voltages as high as this are suitable for driving the CMOS device directly without any outside power assist.

TABLE 1

| Pad Position | Output (millivolts) |
| --- | --- |
| 1 | 250 |
| 2 | 28 |
| 3 | 160 |
| 4 | 250 |
| 5 | 400 |
| 6 | 850 |
| 7 | 160 |
| 8 | 775 |
| 9 | 725 |
| 10 | 900 |
| 11 | 700 |
| 12 | 1350 |
| 13 | 1200 |
| 14 | 1800 |
| 15 | 1300 |
| 16 | 1500 |
| 17 | 1250 |
| 18 | 1350 |
| 19 | 1300 |
| 20 | 1300 |
| 21 | 1950 |
| 22 | 2300 |
| 23 | 1125 |
| 24 | 1150 |

Conceivably the present invention can take the form of a signal generator having a single touch sensitive location on its surface such as would be used as an on-off indicator, for example. As a practical matter, the invention will have its broadest utilization in those applications involving several touch sensitive locations on its surface such as would be the case as a floor selector in an elevator environment. A related but similar application for those devices having multiple sensitive areas, is as a security device such as on a file cabinet or a door lock. With a plurality of sensitive areas on the touch switch, the device can be used in combination with a signal processor which is made responsive to a preselected sequence of input pulses from these sensitive regions themselves resulting in a coded control.

Although this invention has been shown and described with respect to preferred embodiments thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. An electrical signal generator comprising:
    a substrate of conductive material which forms a first electrode;
    a coating of piezoelectric material including an interbonded mixture containing phosphorous, zirconium, titanium and chromium chemically bonded to one side of the substrate by the attachment of phosphate ions in the mixture to the substrate due to ionic bonding;
    a region of conductive material which is joined to the exposed surface of the piezoelectric material and forms a second electrode; and
    electrical conduction means attached to the first electrode and the second electrode to conduct away as useful electrical signals, electric pulses established across the piezoelectric material due to force applied to the substrate.

2. The invention according to claim 1 wherein a plurality of regions of conductive material which is isolated from each other are formed on the exposed surface of the piezoelectric material forming a plurality of discrete second electrodes and electrical conduction means are attached to each of the second electrodes.

3. The invention according to claim 2 including further means for covering the exposed surfaces of the piezoelectric material to prevent contamination thereof.

4. The invention according to claim 3 wherein the covering is an elastomeric material.

5. The invention according to claim 4 including further a frame which supports the substrate along its edges.

6. The invention according to claim 5 wherein the substrate is a thin sheet of metal.

7. The invention according to claim 2 including further a base which is held by the frame assembly adjacent to the ceramic material to support the substrate, the base having depressions adjacent to each of the second electrodes to allow the substrate to be displaced to the direction of the base without interference.

8. The invention according to claim 7 wherein the exposed surface of the substrate adjacent to each of the second electrodes is visibly designated.

9. The invention according to claim 8 including further a flexible covering on the flat surface of the substrate without the piezoelectric coating.

10. The invention according to claim 9 including further a signal processor which receives the electric pulses from the conduction means and provides an output signal.

11. The invention according to claim 10 including further an auxiliary power source which receives the output from the signal processor and amplifies the power thereof.

12. An electrical signal generator comprising:
    a structural member comprising a resilient substrate of conductive material which is rigid and flexes under the force ordinarily provided from contact with a pressing finger, and forms a first electrode;
    a coating of piezoelectric material including an interbonded mixture containing phosphorous, zirconium, titanium and chromium chemically bonded to one side of the substrate by the attachment of phosphate ions in the mixture of the substrate due to ionic bonding;
    a region of conductive material which is joined to the exposed surface of the piezoelectric material and forms a second electrode; and
    electrical conduction means attached to the first electrode and the second electrode to conduct away as useful electrical signals electric pulses established across the piezoelectric material as a result of flexing of the substrate due to forces applied thereto.

13. A signal generator comprising:
    a substrate which forms a common electrode;
    a coating of piezoelectric material deposited on the substrate as a slurry and dried at a temperature sufficient to allow the coating which includes an interbonded mixture containing phosphorous, zirconium, titanium and chromium to adhere to the substrate by the attachment of phosphate ions in the mixture to the substrate due to ionic bonding;
    a second electrode which is formed on the exposed surface of the piezoelectric coating; and
    electrical connection means attached to the second electrode.

14. The invention according to claim 13 including further additional second electrodes so disposed on the exposed surface of the piezoelectric coating that each is isolated from the other, and additional electrical connection means formed to the additional second electrodes to allow individual electrical contact with each of the second electrodes.

15. A signal generator comprising:
    a structural member comprising a resilient metal substrate which forms a common electrode, is rigid, flexible and electrically conductive;
    a coating of piezoelectric material deposited on the substrate as a slurry and dried at a temperature sufficient to allow the coating which includes an interbonded mixture containing phosphorous, zirconium, titanium and chromium to chemically bond to the substrate by the attachment of phosphate ions in the mixture to the substrate due to ionic bonding;
    a second electrode which is formed on the exposed surface of the piezoelectric coating; and
    electrical connection means connected to the second electrode.

* * * * *